US008390094B2

(12) United States Patent
Nakajima et al.

(10) Patent No.: US 8,390,094 B2
(45) Date of Patent: Mar. 5, 2013

(54) SWITCHING ELEMENT, VARIABLE INDUCTOR, AND ELECTRONIC CIRCUIT DEVICE HAVING CIRCUIT CONFIGURATION INCORPORATING THE SWITCHING ELEMENT AND THE VARIABLE INDUCTOR

(75) Inventors: Kunihiko Nakajima, Gunma (JP); Hideo Ishihara, Gunma (JP); Yuichi Sasajima, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/241,026

(22) Filed: Sep. 22, 2011

(65) Prior Publication Data

US 2012/0018842 A1    Jan. 26, 2012

Related U.S. Application Data

(63) Continuation of application No. 12/235,525, filed on Sep. 22, 2008, now Pat. No. 8,053,864.

(30) Foreign Application Priority Data

Sep. 22, 2007 (JP) ................ 2007-246323
Jul. 25, 2008 (JP) ................ 2008-192865

(51) Int. Cl.
    *H01L 27/02* (2006.01)
(52) U.S. Cl. ........... 257/531; 257/277; 257/E27.009; 257/E21.022; 336/10

(58) Field of Classification Search .......... 257/277, 257/531, E27.009, E21.022; 336/10
See application file for complete search history.

(56) References Cited

U.S. PATENT DOCUMENTS

| 4,843,358 | A |   | 6/1989 | Meise et al. |
|-----------|---|---|--------|---------------|
| 5,497,028 | A | * | 3/1996 | Ikeda et al. ............ 257/531 |
| 5,872,384 | A | * | 2/1999 | Gabara .................. 257/421 |

FOREIGN PATENT DOCUMENTS

| JP | 08-162331 A | 6/1996 |
|----|--------------|--------|
| JP | 2004-140165 A | 5/2004 |

\* cited by examiner

*Primary Examiner* — Kenneth Parker
*Assistant Examiner* — Yu Chen
(74) *Attorney, Agent, or Firm* — Chen Yoshimura LLP

(57) ABSTRACT

An inexpensive variable inductor has inductance value continuously changeable without reducing a Q value. When a control voltage is applied to a control terminal of a MOS transistor from a power supply, a continuity region is formed in a channel, and a region between main terminals becomes conductive. When the control voltage is changed, length of the continuity region in the channel is changed. This changes length of a path area of an induced current, flowing in an induced current film. Thus, the amount of induced current is increased or decreased. Therefore, when the control voltage of the MOS transistor is changed, the inductance value of the coil is continuously changed.

10 Claims, 8 Drawing Sheets

(A)

(B)

(C)

(A)

(B)

(C)

(A)

(B)

(A)

(B)

(C)

(D)

SWITCHING ELEMENT, VARIABLE INDUCTOR, AND ELECTRONIC CIRCUIT DEVICE HAVING CIRCUIT CONFIGURATION INCORPORATING THE SWITCHING ELEMENT AND THE VARIABLE INDUCTOR

This application is a Continuation of a pending application, U.S. application Ser. No. 12/235,525 filed on Sep. 22, 2008, which is hereby incorporated by reference in its entirety.

BACKGROUND OF THE INVENTION

1. Field of the Invention

The present invention relates to a semiconductor switching element, a variable inductor, and an electronic circuit device having a circuit configuration incorporating the switching element and the variable inductor therein. Specifically, the invention relates to a switching element having a continuity control region in which length of a continuity region for switching can be varied, and a variable inductor using the switching element to be able to vary the inductance.

2. Description of the Related Technology

In a variable matching circuit, variable filter circuit, or variable oscillation circuit, an inductance value or a capacitance value of an LC resonance circuit is appropriately changed, thereby variable operation of each function is achieved. Generally, when the capacitance value is changed, a variable capacity diode is used. Since the variable capacity diode uses reverse bias capacitance characteristics of a semiconductor junction, the capacitance value can be continuously changed in the diode. In addition, since the variable capacity diode can be formed using a typical semiconductor process, reduction in cost can be achieved. On the other hand, an effective element for changing the inductance value is hardly found. Therefore, the variable matching circuit, variable filter circuit, or variable oscillation circuit often operates while changing only the capacitance value. However, if each circuit can operate while further changing the inductance value, a frequency variation range of a circuit is widened, and thus a circuit function that has been achieved by a number of resonance circuits in the past can be achieved by a smaller number of resonance circuits, and consequently reduction in size of a circuit can be achieved. From such a reason, a variable inductor, of which the inductance value can be continuously changed, is desired.

As variable inductors in the related art, variable inductors disclosed in JP-A-8-162331 and JP-A-2004-140165 are given. JP-A-8-162331 discloses a variable inductor including a plurality of loop-like wiring layers having open ends at a lower part of a spiral inductor, a field-effect transistor as a switch for opening/short-circuiting each of the open ends, and an insulating film formed between the spiral inductor and the wiring layers; wherein the switch is opened and closed to vary an inductance value. JP-A-2004-140165 discloses a variable inductor including a first inductor having a predetermined inductance value, a second inductor having a predetermined inductance value, the second inductor being formed having mutual inductance with respect to the first inductor, and a variable resistance connected between terminals of the second inductor; wherein a resistance value of the variable resistance is continuously changed, thereby an inductance value between terminals of the first inductor is continuously varied.

However, the following inconveniences or problems exist in the background art as above.

(1) In the variable inductor of JP-A-8-162331, since an inductance value is digitally changed, it cannot be continuously changed. Therefore, accurate changing of the inductance value cannot be achieved.

(2) In the variable inductor of JP-A-2004-140165, while the inductance value can be continuously changed, since an induced current flowing in a coupling coil is consumed by a resistive element, a Q value is significantly reduced.

Features of the background art disclosed in JP-A-8-162331 and JP-A-2004-140165 are summarized as shown in the following Table 1.

TABLE 1

| Method | | Is inductance continuously changed? | Is Q value high? |
|---|---|---|---|
| JP-A-8-162331 | ON/OFF of coupling circuit | No | Yes |
| JP-A-2004-140165 | Increasing or decreasing resistance value of coupling coil | Yes | No |

SUMMARY OF CERTAIN INVENTIVE ASPECTS

Certain inventive aspects provide a variable inductor of which the inductance value can be continuously changed within a predetermined range without reducing a Q value. Certain inventive aspects provide a semiconductor switching element used for the variable inductor as a preferable application example thereof.

In one aspect, a switching element includes a switching element that controls continuity with a pair of main terminals facing each other in parallel in a semiconductor substrate by a control voltage to be applied to a control terminal arranged on the semiconductor substrate, the switching element being designed such that the pair of main terminals are formed long while being kept in parallel, and a region, across which the main terminals are opposed long and in parallel, is made to be a continuity control region, and the control terminal is formed covering the continuity control region, and a continuity control unit is provided, which changes length of a continuity region of the continuity control region by changing a value of the control voltage.

One major mode of the switching element is designed such that when the control voltage is applied to the continuity control region via an insulator provided on the semiconductor substrate, thickness of the insulator is changed along a length direction of the continuity control region, leading to operation as the continuity control unit. In another mode, a control terminal formed along a length direction of the continuity control region is made as a resistor, and thereby distribution of the control voltage is changed along the length direction of the continuity control region, leading to operation as the continuity control unit. In still another mode, impurity concentration in the semiconductor substrate in the continuity control region is changed along the length direction of the continuity control region, leading to operation as the continuity control unit.

In another aspect, the switching element is designed such that the switching element has a P-type or N-type semiconductor substrate, a pair of $N^+$-type or P-type main terminals having a predetermined length in a surface area extending from at least approximately the center of the semiconductor substrate to the periphery thereof, an insulating layer provided in order to form a channel on the semiconductor substrate between the main terminals, and a control terminal formed on a top of the insulating layer, so that the continuity control region is varied.

A variable inductor includes a variable inductor having a coil, an induced current film in which an induced current flows by applying a current to the coil, and one of the above switching elements, the variable inductor being designed such that the induced current film is electrically connected to the pair of main terminals of the switching element, and a notch is provided in a flow path of the induced current, and a continuity control region of one of the switching elements is situated in the notch. An electronic circuit device may be designed to include the switching element or the variable inductor.

In another aspect, the variable inductor is designed to have a P-type or N-type semiconductor substrate; a pair of N$^+$-type or P-type main terminals having a predetermined length in a surface area extending from at least approximately the center of the semiconductor substrate to the periphery thereof; an insulator provided in order to form a channel on the semiconductor substrate between the main terminals; a control terminal formed on a top of the insulator; a pair of connected conductors being situated at both sides in a length direction of the insulator and the control terminal, and formed on respective tops of the main terminals; an induced current control film having a slit formed while removing a portion of the induced current control film corresponding to a top of the formed control terminal, and including a conductor formed conducting to the connected conductors at edges of the slit; and a coil formed in a planarly rounded manner on the induced current control film via an insulating layer. The described and other objects, features, and advantages of certain inventive aspects will be clarified from the following detailed description and accompanying drawings.

According to certain inventive aspects, a switching element can be provided, in which switching length can be varied on a line or plane. In addition, a variable inductor can be provided by using the switching element, in which an inductance value can be continuously changed within a predetermined range without reducing a Q value.

BRIEF DESCRIPTION OF THE DRAWINGS

FIGS. 1A to 1C show a variable inductor of example 1 of one embodiment, wherein FIG. 1A shows a plan view, FIG. 1B shows an end view seen in an arrow direction along a line #A-#A in FIG. 1A, and FIG. 1C shows an end view seen in an arrow direction along a line #B-#B in FIG. 1A;

FIGS. 3A to 3B show diagrams showing a result of simulation based on a sample of the example 1, wherein FIG. 3A shows a graph showing a relationship between frequency and an inductance value at each notch length, and FIG. 3B shows a graph showing a relationship between notch length and an inductance value at 4 GHz in FIG. 3A;

FIGS. 4A to 4D show a variable inductor of example 2 of one embodiment, wherein FIG. 4A shows a plan view, FIG. 4B shows an end view seen in an arrow direction along a line #C-#C in FIG. 4A, FIG. 4C shows an end view seen in an arrow direction along a line #D-#D in FIG. 1A, and FIG. 4D shows a graph showing an aspect of change in voltage at a control terminal;

FIGS. 5A to 5D show a variable inductor of example 3 of one embodiment, wherein FIG. 5A shows a plan view, FIG. 5B shows an end view seen in an arrow direction along a line #E-#E in FIG. 5A, FIG. 5C shows an end view seen in an arrow direction along a line #F-#F in FIG. 5A, and FIG. 5D shows a graph showing change in impurity concentration in a channel;

FIGS. 6A to 6C show views showing another example of one embodiment, wherein FIG. 6A shows a plan view, and FIGS. 6B and 6C show end views seen in an arrow direction along a line #P-#P in FIG. 5A respectively;

FIGS. 8A to 8C show views showing still another example of one embodiment, wherein FIGS. 8A and 8C show major end views respectively, and FIG. 8B shows a plan view of the example of FIG. 8A.

DETAILED DESCRIPTION OF CERTAIN ILLUSTRATIVE EMBODIMENTS

Hereinafter, certain embodiments will be described in detail according to examples.

Example 1

Figure 1:
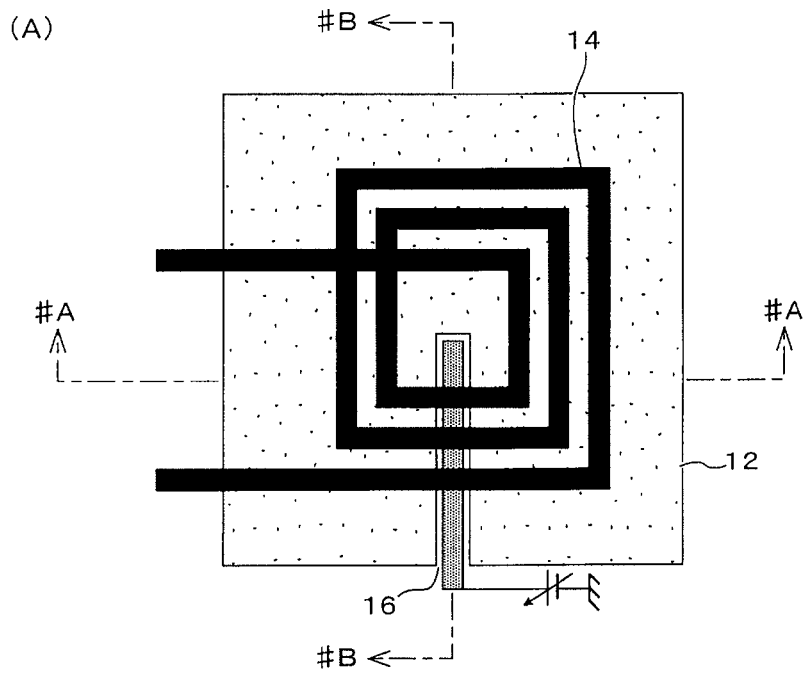
Figure 1:
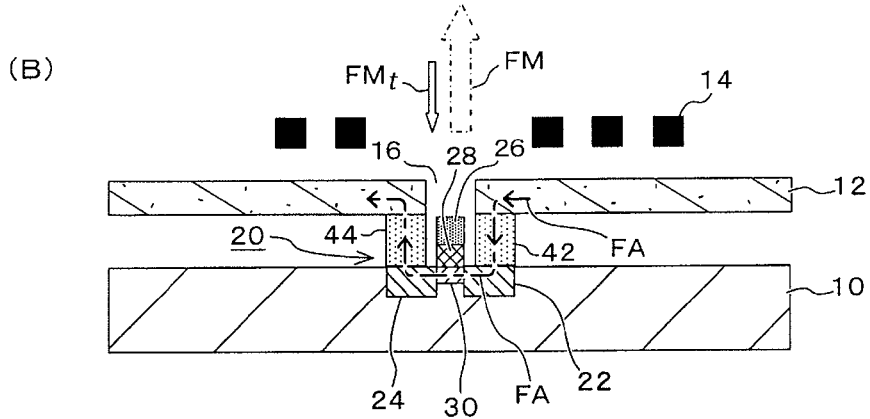
Figure 1:
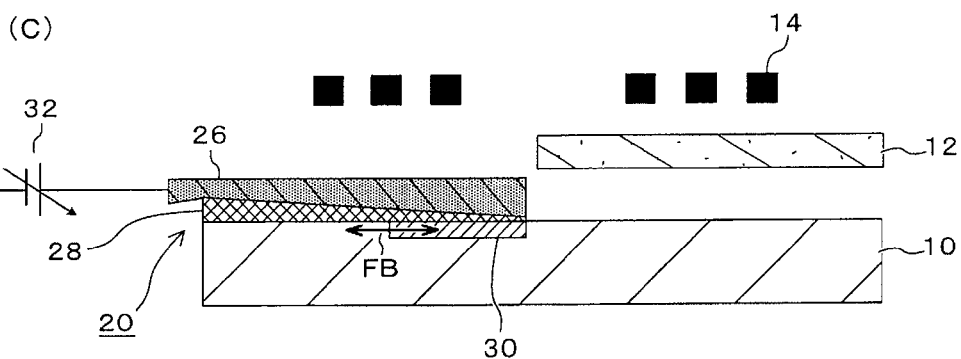

First, example 1 of one embodiment is described with reference to FIGS. 1A to 1C, 2A to 2C, and 3A to 3B. FIG. 1A shows a plan view of a variable inductor of the example, FIG. 1B shows an end view seen in an arrow direction along a line #A-#A in FIG. 1A, and FIG. 1C shows an end view seen in an arrow direction along a line #B-#B in FIG. 1A.

A configuration of a variable inductor is described. The variable inductor is configured by a switching element part and an inductor part. First, to describe the switching element part, for example, a semiconductor is used for a square silicon semiconductor substrate 10 (hereinafter, referred to as "substrate 10"), which is doped with impurities such as indium or boron so as to be made into a P-type semiconductor. Main terminals 22 and 24 are provided extending from approximately the center of the substrate to portions formed by bisecting a side of the periphery of the substrate, the terminals being diffused with phosphorous or the like so as to form a pair of N$^+$-type semiconductors determining a channel space. The substrate 10 has an approximately flat surface. Between one main terminal 22 and the other main terminal 24, an insulator 28 including SiO$_2$ is formed on a substrate 10, for example, by a nano imprinting method using a mold being sloped in a thickness direction so as to be decreased in thickness as approaching the center of the substrate 10 from the periphery thereof.

On a top of the insulator 28, a control terminal 26 including metal such as aluminum is formed with the same width as that of the insulator 28 by a photoresist processing method or the like in a way of cancelling the slope. In the control terminal 26, a DC variable voltage is applied from a power supply 32 with respect to the ground. Such a configuration leads to formation of a kind of special N-MOS FET transistor 20 having a long gate length. The switching element can be achieved even by the same configuration as that of P-MOS FET having a special gate configuration formed on an N-type semiconductor substrate.

The one main terminal 22 and the other main terminal 24 are formed parallel to each other, and one of the terminals acts as a drain or source electrode. By applying the DC variable voltage, a channel 30 is formed in the substrate 10 between the one main terminal 22 and the other main terminal 24. The channel 30 is changed in length depending on a level of a voltage to be applied. This operation causes formation of a continuity control region, and consequently length of a switching region can be changed.

Next, a configuration of an inductor part is described. On tops of the one main terminal 22 and the other main terminal 24 at both sides of the control terminal 26 and the insulator 28 described before, connected conductors 42 and 44 for establishing connection to the switching element part and connection to the inductor part respectively are formed of metal such as aluminum. In each of the figures, while omitted to be shown, an insulating layer including $SiO_2$ is formed on the substrate 10 in a configuration of exposing tops of the connected conductors 42 and 44, and an induced current film 12 is formed on the insulating layer by a photoresist processing technique. As material of the induced current film 12, any material may be used if it has high conductivity. For example, the film 12 is formed of copper.

In the induced current film 12, a slit is formed, the slit having a width corresponding to the length including both side spans of the control terminal 26 and the insulator 28 of the switching element part, that is, a notch 16 is formed. The connected conductor 42 or 44 plays a role of connecting between the one main terminal 22 or the other main terminal 24 and each edge portion of the notch 16 of the induced current film 12 in the switching element part.

Furthermore, on a top of the induced current film 12 including a top of an area of the notch 16, an insulating layer including $SiO_2$ is formed covering the whole exposed surface. On a top of the insulating layer formed in this way, a planar coil 14 (hereinafter, referred to as "coil 14") having the number of turns of, for example, 2.75 is formed by the photoresist processing technique such that a space is formed in a central portion. As material of the coil 14, any material can be used if it has high conductivity. For example, the coil 14 is formed of copper. It will be appreciated that an insulating layer is formed over a region, in which a lead line in a surrounding end of the coil 14 overlaps with a surrounding coil line, to prevent short-circuit.

To describe basic operation, when a signal current (high-frequency current) or the like flows into the coil 14, a magnetic field is generated, and the magnetic field penetrates the induced current film 12 arranged near the coil. Thus, a current is induced in the induced current film 12, causing an induction field. The induction field is generated in a direction of obstructing the magnetic field generated in the coil 14. As a result, the total magnetic field to be generated is decreased, and accordingly the inductance value is decreased. In such a case, the amount of decrease in inductance value is proportional to the amount of induced current flowing in the induced current film 12. One embodiment includes a configuration using a principle that an inductor is combined with a switching element for continuously changing the amount of current flowing in the induced current film 12, thereby the inductance value of the coil 14 can be continuously changed within a predetermined range.

In the example, the notch 16 is formed in a direction of dividing the induced current flowing in the induced current film 12. In the notch 16, a MOS transistor 20 having a long gate length is formed as described before. One main terminal 22 of the MOS transistor 20 is connected to an edge of the notch 16 of the induced current film 12 via the connected conductor 42, and the other main terminal 24 of the MOS transistor 20 is connected to another edge of the notch 16 of the induced current film 12 via the connected conductor 44. That is, in a configuration of the example, the main terminals of the MOS transistor 20 are connected to the induced current film 12 along the notch 16 of the induced current film 12 respectively.

When a voltage is applied between the control terminal 26 and ground, the channel 30 is formed between the main terminals 22 and 24. That is, the channel 30 is formed along the notch 16. The control terminal (gate) 26 is opposed to the channel 30 with the insulator 28 including an oxide film such as $SiO_2$ between them, and the control terminal and the channel collectively configure the MOS transistor 20. The channel 30 formed between the main terminals 22 and 24 can be varied in length via the insulator 28 by changing the voltage applied to the control terminal 26, leading to ON/OFF operation at a predetermined length.

In the example, thickness of the insulator 28 slopes along the notch 16 of the induced current film 12. In the example, the insulator 28 is formed to have the largest thickness at an end at a periphery side of the induced current film 12, and to be gradually decreased in thickness as approaching the center of the induced current film 12. Therefore, a threshold voltage of the channel 30 continuously changes depending on a depth position (position in a horizontal direction in FIG. 1C) of the channel. Consequently, when a predetermined control voltage (gate voltage) is applied to the control terminal 26 from the power supply 32, an ON region of the channel 30, namely, a continuity region, and an OFF region thereof are formed with a position of a threshold voltage corresponding to the control voltage as a boundary, and as the control voltage is changed, so that the boundary position, namely, width of the continuity region is changed. FIG. 1(C) shows an aspect of such a phenomenon, wherein an ON/OFF boundary of the channel 30 varies in a depth direction as shown by an arrow FB by changing the control voltage. In other words, by changing the control voltage, for example, length of the continuity region extending from the center to the periphery can be controlled. Conductivity of the channel 30 between the main terminals 22 and 24 can be controlled by changing a voltage between the control terminal 26 and the main terminal 22 or 24 to be a source side terminal (main terminal to be connected with a minus side of the control voltage). Such conductivity control is performed as needed.

Next, overall operation in the example is described. When the control voltage is applied to the control terminal 26 of the MOS transistor 20 from the power supply 32, the continuity region corresponding to the control voltage is formed as described before. In the continuity region, a region between the main terminal 22 and 24 becomes conductive. Therefore, electrical connection is made across the notch 16 of the induced current film 12 in the continuity region, and consequently induced current flows in a direction shown by an arrow FA in FIG. 1B (or in an opposite direction).

Figure 2:
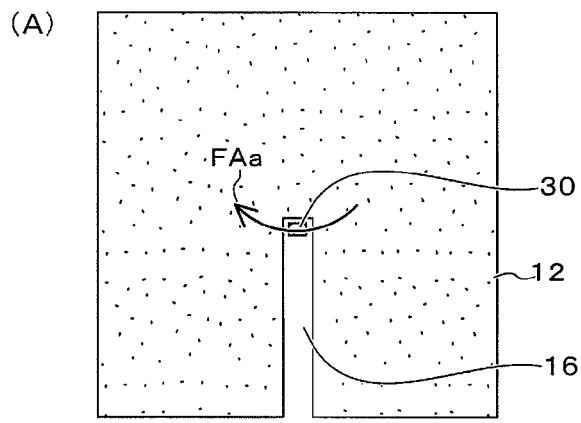
FIGS. 2A to 2C show plan views showing an aspect of controlling an induced current in the example 1.
Figure 2:
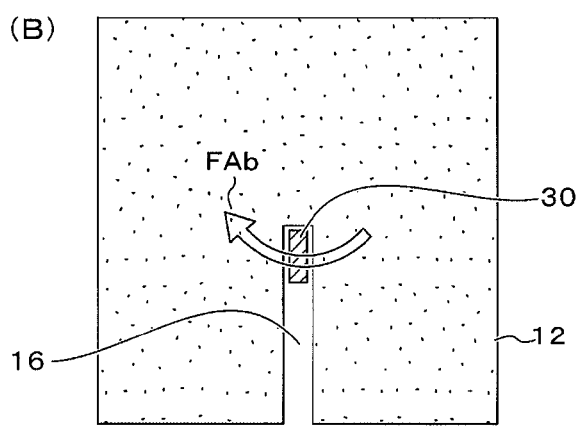
Figure 2:
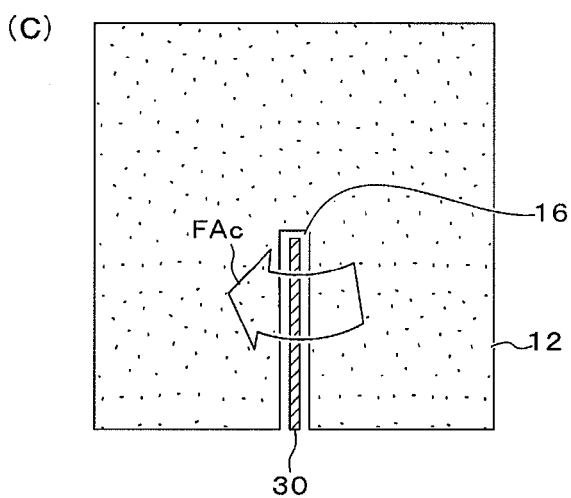

When such an aspect is seen in planar view, FIGS. 2A to 2C are given. In the case that the control voltage applied to the MOS transistor 20 is relatively low, length of the continuity region is short, and the induced current flows through the region as shown by an arrow FAa (or an opposite direction), as shown in FIG. 2A. In this state, when the control voltage applied to the MOS transistor 20 is increased, length of the continuity region is increased, and the induced current flows through the region as shown by an arrow FAb (or an opposite direction), as shown in FIG. 2B. When the control voltage is further increased, the induced current flows as shown by an arrow FAc in FIG. 2C. In this way, the control voltage applied to the MOS transistor 20 is changed, thereby length of a path, across which the induced current flows in the induced current film 12, is changed, and consequently the amount of induced current increases or decreases. In addition, a degree of such increase or decrease continuously changes according to the control voltage applied to the MOS transistor 20.

On the other hand, as described before, an induction field caused by the induced current, for example, in a direction of an arrow FMt is generated in a direction of disturbing a magnetic field caused by applying a current to the coil 14, for example, in a direction of an arrow FM in FIG. 1B, so that an inductance value is decreased. In such a case, the amount of decrease in inductance value is proportional to the amount of induced current flowing in the induced current film 12.

Therefore, according to the example, as the control voltage to the MOS transistor 20 is changed, thereby the inductance value of the coil 14 can be continuously changed within a certain range. Moreover, since the amount of induced current corresponds to length of the continuity region, and a resistance value of a flow path of the induced current is not changed, reduction of the Q value can be excellently suppressed. Furthermore, the amount of induced current is controlled by the MOS transistor 20 that can be produced using a typical semiconductor process without using a MEMS process, which is advantageous in cost.

Here, simulation was conducted to confirm one of the advantages of one embodiment shown in the example 1. First, an assumed sample of the simulation is described. A P-type silicon semiconductor substrate 10, which is in a shape of a square having one side of 320 µm and thickness of 300 µm, is doped with indium as an impurity, and doped with phosphorous such that a pair of main terminals including an $N^+$ semiconductor 135 µl in length and 30 µm in width are buried with an interval of 2 µm, leading to formation of the main terminals 22 and 24. On tops of the main terminals 22 and 24, the connected conductors 42 and 44 including aluminum are provided with thickness of about 2 µm respectively, and a $SiO_2$ oxide film having the same thickness as thickness of each of the connected conductors 42 and 44 is formed on a top of the P-type silicon substrate 10 surrounding the connected conductors 42 and 44. The insulator 28 made of $SiO_2$ is formed between the connected conductors 42 and 44 such that thickness of the insulator is up to 200 nm at a periphery side of the substrate 10, and the thickness is smaller at a position closer to the center of the substrate.

The control terminal 26 including aluminum is formed on a top of the insulator layer 28 such that a height from a surface of the substrate 10 becomes same between planes of tops of the connected conductors 42 and 44. On a top of the $SiO_2$ oxide film formed surrounding the connected conductors 42 and 44, the induced current film 12 including aluminum 1 µm in thickness is formed, the film 12 being shaped to be a quadrilateral having a peripheral side of 220 µm. Width of the notch 16 of the induced current film 12 was assumed to be 20 µm, and a length of the notch from the center of the film was assumed to be able to have any value between 0 µM and 110 µm.

A $SiO_2$ oxide film approximately 3 µm in thickness is formed on a top of the induced current film 12 except an area corresponding to the notch 16. On a top of the $SiO_2$ oxide film, a planar coil 14 is formed in a configuration that a coil conductor including copper, of which the outermost circumference forms a quadrilateral having a side of 170 µm, is wound by 2.75 turns directing to the center in a shape of square spiral with a thickness of 3 µm, width of 10 µm, and coil conductor spacing of 10 µm, and a square space having a side of 70 µm is formed in the center. A $SiO_2$ oxide film is formed over the coil conductor. A lead conductor of the coil conductor is led from a trailing end of the coil conductor through a hole opened in the $SiO_2$ oxide film.

In the simulation, the continuity region of the switching element part was able to have any value between 0 µm and 110 µm. A case that length of the notch 16 is 0 µm shows the same condition as a condition that the continuity region is formed over the overall length, which is equivalent to a condition that the induced current FAc flows in the whole region while no notch exists in the induced current film 12. A case that the notch 16 extends by 80 µm from the periphery toward approximately the center shows a condition that a continuity region of the switching element is formed as shown in FIG. 2B, which is equivalent to a condition that the induced current FAb flows within a range of about one fourth of length of the notch 16. Furthermore, a case that length of the notch 16 is 110 µm shows a condition that the notch 16 exists over the overall length from the periphery of the induced current film to approximately the center thereof, so that the induced current hardly flows. In this way, while length of the notch 16 was changed, operation of the switching element part was represented using a simulation sample. Specifically, an ON/OFF boundary of the channel of the switching element part was equivalently expressed as length of the notch 16.

Figure 3:
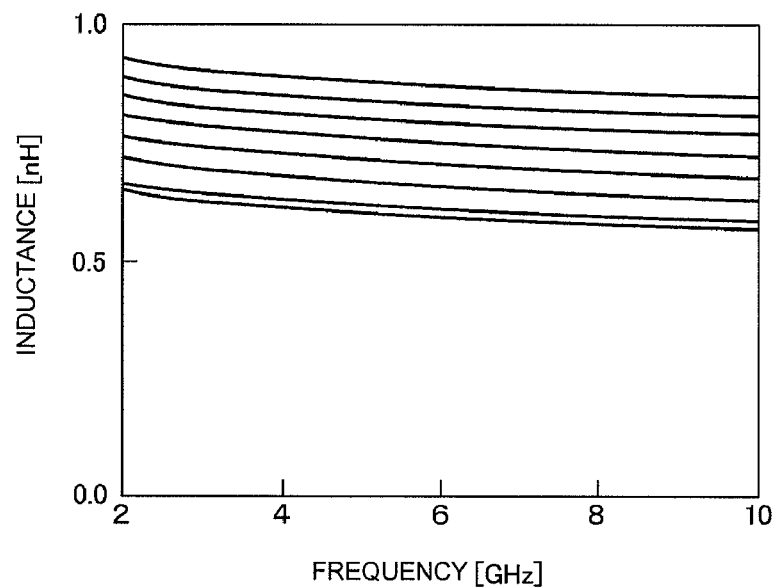
Figure 3:
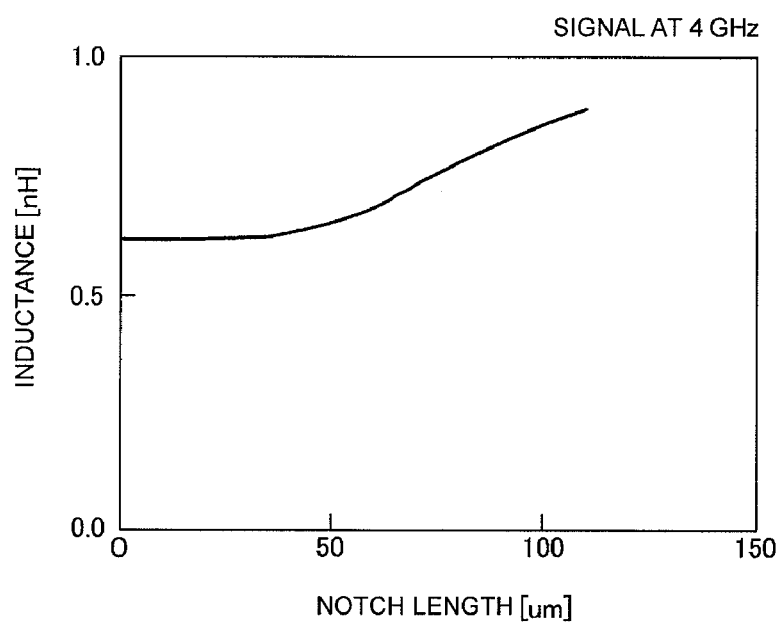

FIGS. 3A and 3B show a simulation result based on such a sample. In an example of one embodiment, a high-frequency signal current is flowed into the coil conductor, and thereby an induced current is generated in the induced current film 12. An induction field caused by the induced current is generated in a direction of cancelling the magnetic field generated by the coil 14. As a result, inductance of the coil 14 decreases in proportion to the amount of induced current generated in the induced current film 12. It will be appreciated that the amount of induced current film 12 is controlled by length of the notch 16. The simulation result of FIG. 3A shows a relationship between inductance at each length of the notch 16 and a frequency. A plurality of trajectories show inductance at respective lengths of the notch 16, extending from the periphery toward the center, including 110 µm, 100 µm, 90 µm, 80 µm, 70 µm, 60 µm, 40 µm and 0 µm in order from top to bottom. It is seen that inductance at each notch length is not significantly affected by frequency and thus hardly varies, and consequently kept to be approximately constant.

FIG. 3B shows, focusing inductance at 4 GHz in FIG. 3A, a relationship between length of the notch 16, or length of the continuity region of the switching element and inductance. From the figure, it is known that when length of the notch 16 is changed, that is, when the ON/OFF boundary of the channel of the switching element part is changed by changing the control voltage, inductance is continuously changed within a range of approximately 0.6 nH to 0.9 nH.

Such a continuously variable inductor is provided. Thus, in a variable matching circuit, variable filter circuit, or variable frequency oscillation circuit, an inductance value of an LC resonance circuit is changed, which helps to achieve variable operation of a circuit function, in addition, can contribute to reduction in size of such circuit devices.

Example 2

Figure 4:
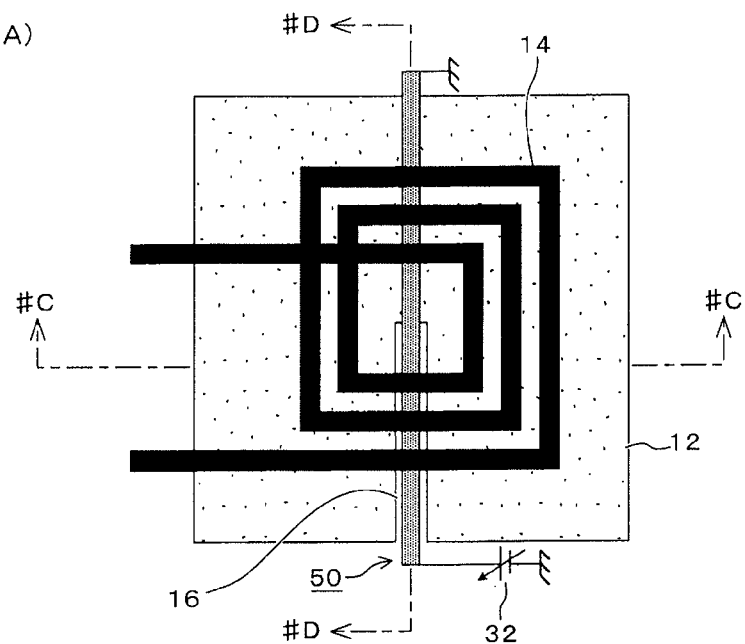
Figure 4:
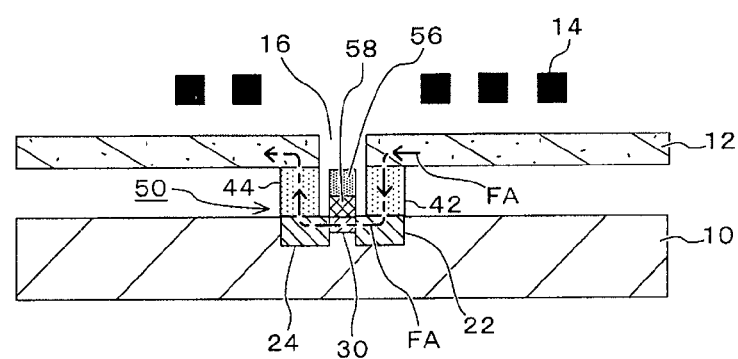
Figure 4:
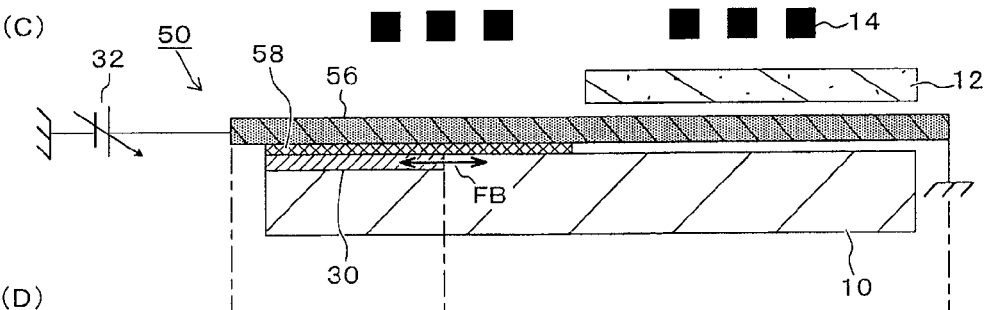
Figure 4:
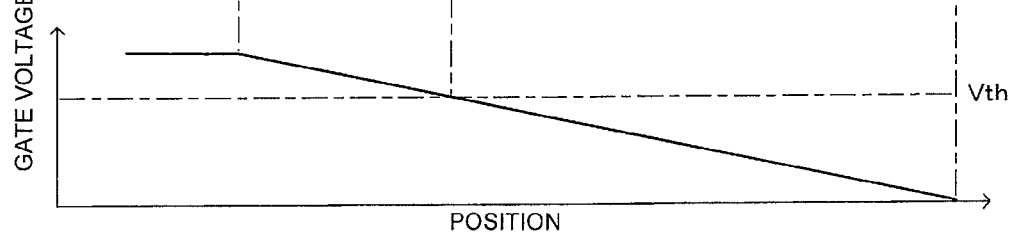

Next, example 2 of one embodiment is described with reference to FIGS. 4A to 4D. Identical reference numerals and signs are used for components identical or corresponding to components in the above example. The example is different in portion of a MOS transistor 50 from the example 1. FIG. 4A shows a plan view of a variable inductor of the example, FIG. 4B shows an end view seen in an arrow direction along a line #D-#D in FIG. 4A, and FIG. 4C shows an end view seen in an arrow direction along a line #D-#D in FIG. 4A. As shown in the figures, an insulator 58 of the MOS transistor 50 of the example has the same thickness over a width direction of the channel 30, namely, over a direction of the notch 16. Thus, the same ON/OFF threshold voltage of a channel is given at each position.

On the other hand, a control terminal 56 is formed using a high-resistance resistor, which is formed of polysilicon by a photoresist processing technique, in a manner of extending to an end of the induced current film 12 beyond an end of the notch 16 of the induced current film 12. Both ends of the control terminal are applied with a control voltage from the power supply 32. Therefore, voltage distribution in the control terminal 56 slopes in a longitudinal direction of the notch as shown in FIG. 4D, and a voltage of the power supply 32 is given at one end, and GND (OV) is given at the other end. A certain potential may be used in place of GND. When the voltage of the power supply 32 is changed in this condition, a slope of a graph in FIG. 4D is changed, and a position of a threshold voltage Vth of the channel 30 is changed in a horizontal direction in FIG. 4D. Therefore, even according to the example, width of the continuity region varies as shown by an arrow FB in FIG. 4C, and the control voltage to the MOS transistor 50 is changed, thereby the inductance value of the coil 14 can be continuously changed within a predetermined range, as in the example 1.

Example 3

Figure 5:
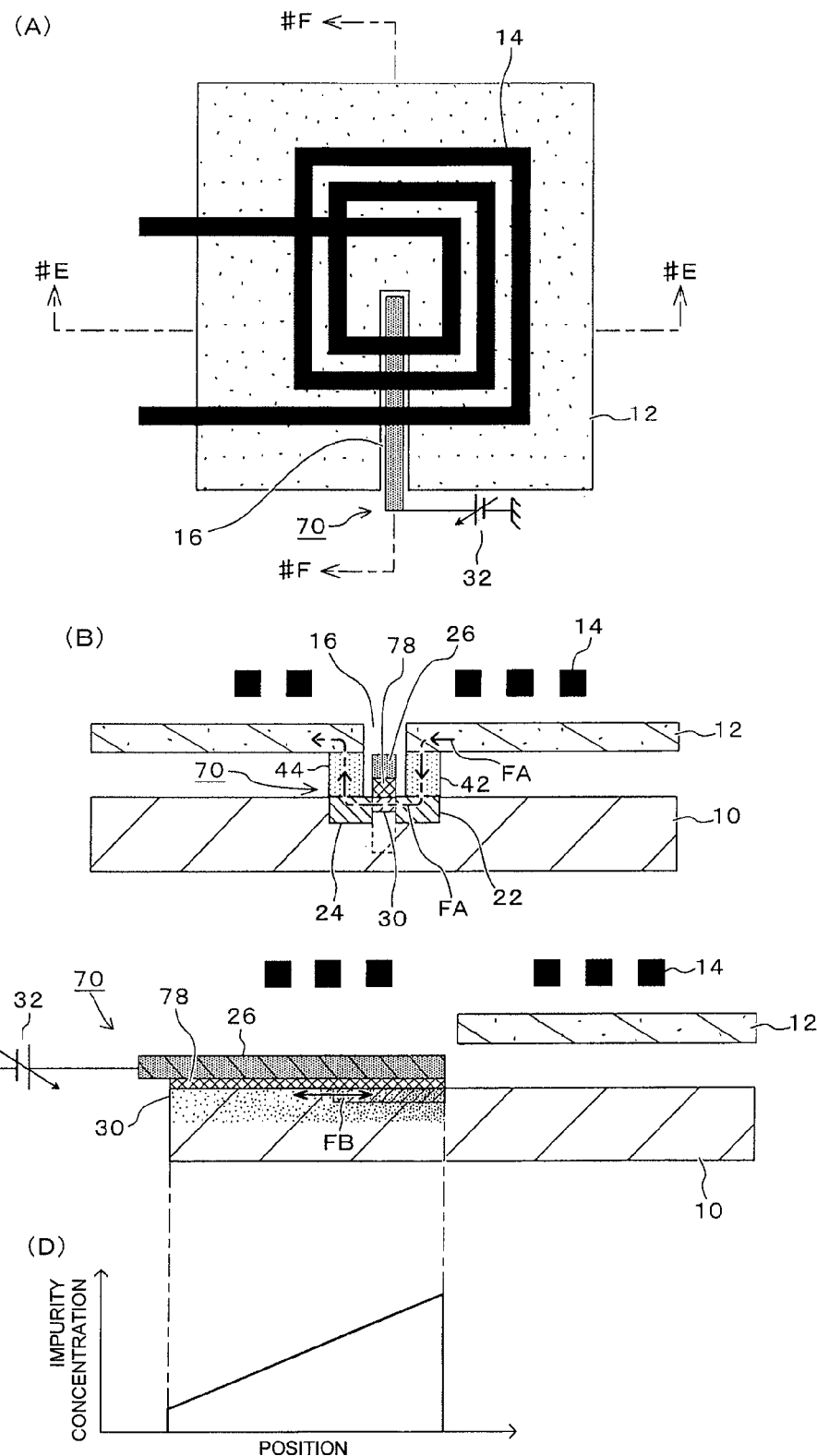

Next, example 3 of one embodiment is described with reference to FIGS. 5A to 5D. The example is different in portion of a MOS transistor 70 from the example 1. FIG. 5A shows a plan view of a variable inductor of the example, FIG. 5B shows an end view seen in an arrow direction along a line #E-#E in FIG. 5A, and FIG. 5C shows an end view seen in an arrow direction along a line #F-#F in FIG. 5A. As shown in the figures, an insulator 78 of the MOS transistor 70 of the example has the same thickness over a width direction of the channel 30 (direction of the notch 16). However, for example, photosensitive resin is printed by a nano imprinting method using a mold sloped in a thickness direction, and an impurity element is ion-implanted onto the printed photosensitive resin, and thereby impurity concentration of the channel 30, that is, a doping level or doping density of impurities continuously slopes, so that an ON/Off threshold voltage of the channel 30 is changed in a width direction of the continuity control region.

In the case of the example, the MOS transistor 70 is a depression-type one in which even if the control terminal 26 is not applied with the control voltage, carriers exist in the channel 30. Therefore, the control voltage is applied to sweep away the carriers and thus carrier concentration in the channel 30 is controlled, so that width of the continuity region is controlled. Consequently, carriers are still left at a higher voltage in a region where doping density of impurities is high in the channel 30, and thus the threshold Vth is high, compared with a region where the doping density is low, and thus the threshold Vth is low.

In a shown example, impurity concentration in the center (right side in FIG. 5C) is set to be high compared with in the outside (left side in FIG. 5C). Therefore, a control voltage higher than the threshold voltage is applied to the control terminal 26 so that carrier generation is suppressed, then the control voltage is gradually decreased. Thus, the continuity region gradually extends from the center side to the outside as shown in FIGS. 2A to 2C. That is, when the control voltage to be applied to the control terminal 26 from the power supply 32 is changed, width of the continuity region is changed as shown by an arrow FB, the inductance value of the coil 14 can be continuously varied within a predetermined range as in the example 1.

Other Examples

Certain embodiments as described above are not limited to the above examples, and can be variously altered or modified within a scope without departing from the scope of these embodiments. For example, the followings are also included.

(1) In the examples, the notch is formed from the center of the induced current film to the end thereof, and the MOS transistor is formed in the notch. However, a plurality of notches may be formed in the induced current film, in addition, the notch is not necessarily formed along a direction of passing through the center of the induced current film. In a word, if a channel of a MOS transistor exists within a path of an induced current, and a span of the current path is changed by changing width of a continuity region formed in the channel, the notch or the MOS transistor may be formed in any way.

Figure 6:
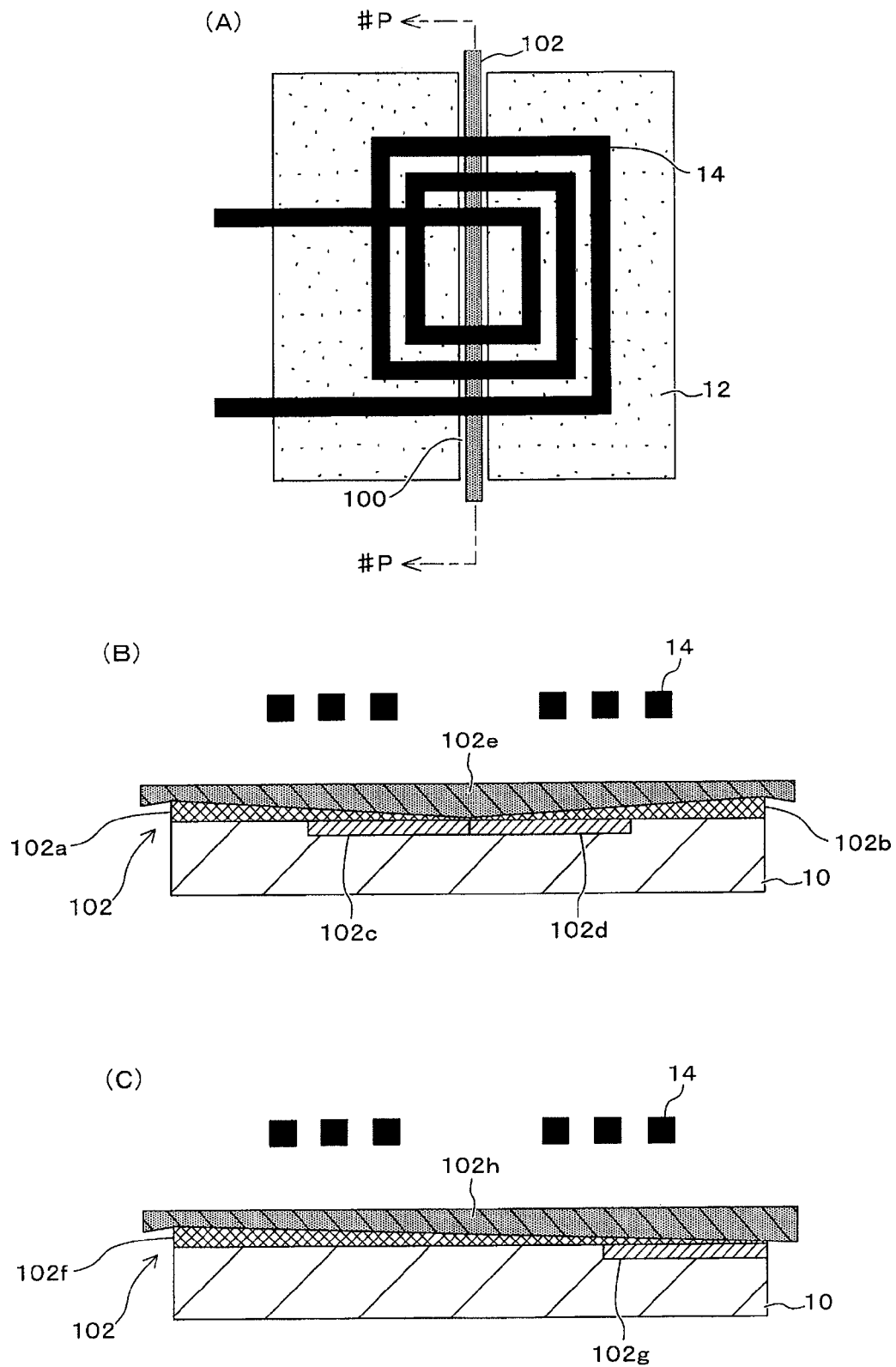

FIG. 6A shows an example where a notch 100 is formed over the overall length of the induced current film 12, and a MOS transistor 102 is formed through the notch. In this case, the MOS transistor 102 is assumed to be, for example, in a configuration as shown in FIG. 6B or FIG. 6C. FIGS. 6B and 6C show end views of the MOS transistor 102 seen in an arrow direction along a line #P-#P in FIG. 6A respectively. First, FIG. 6B shows an example where the MOS transistor 20 shown in FIGS. 1A to 1C is bisymmetrically formed. In the left with respect to the center of the figure, an insulator 102a has a sloped thickness. In the right with respect to the center, an insulator 102b has a sloped thickness. When a control voltage is applied to a control terminal 102e, a continuity region is formed in each of channels 102c and 102d. FIG. 6C shows an example where an insulator 102f has a thickness being continuously sloped over the overall length of the MOS transistor 102. When a control voltage is applied to a control terminal 102h, a continuity region is formed in a channel 102g.

Figure 7:
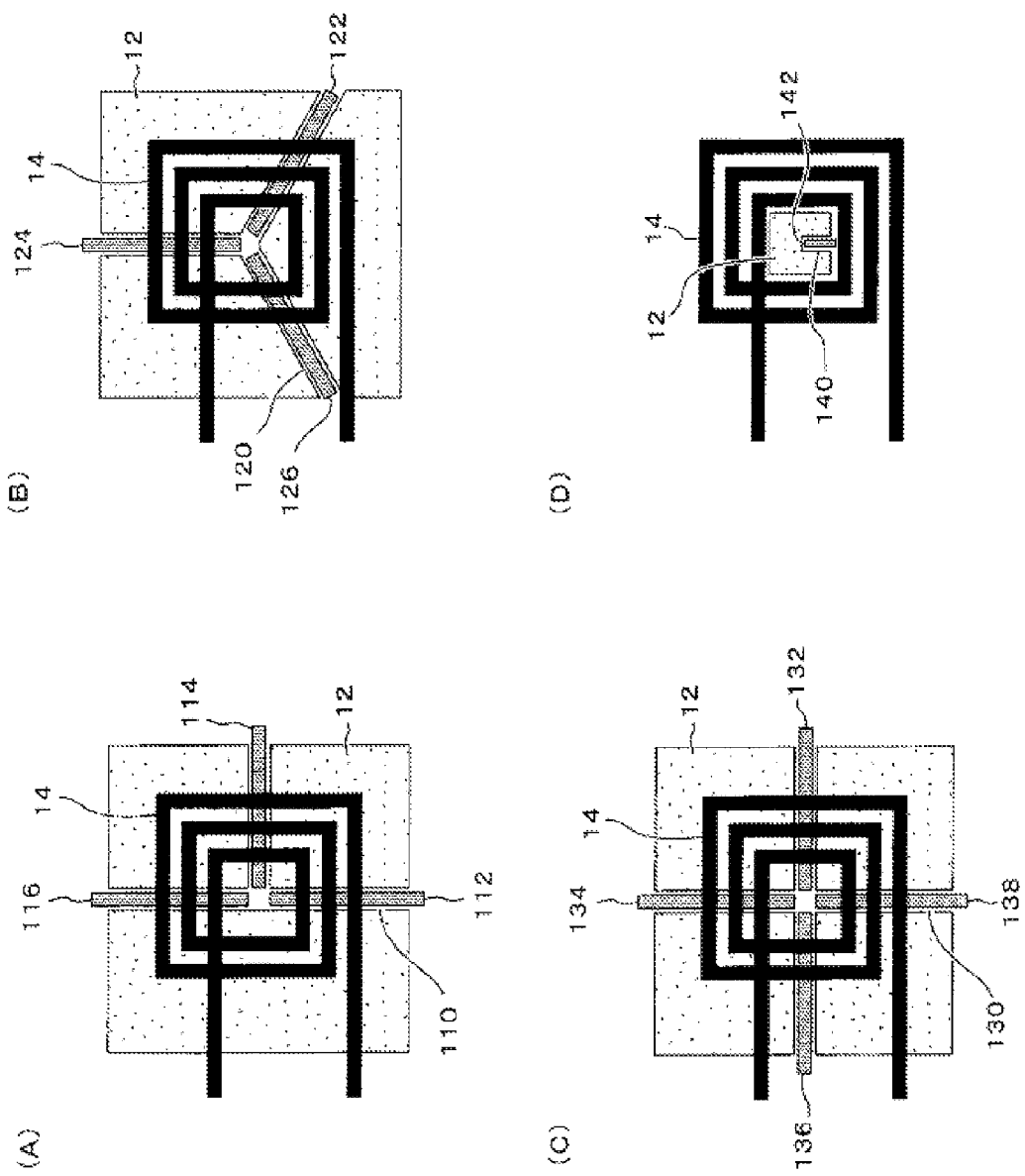
FIGS. 7A to 7D show plan views showing still another example of one embodiment.

FIG. 7A shows an example where an approximately T-shaped notch 110 is formed in the induced current film 12, and MOS transistors 112, 114 and 116 are formed in the notch respectively. FIG. 7B shows an example where a notch 120 is radially formed with an angle of approximately 120 degrees in the induced current film 12, and MOS transistors 122, 124 and 126 are formed in the notch respectively. FIG. 7C shows an example where a notch 130 is formed orthogonally to the induced current film 12, or radially with an angle of approximately 90 degrees, and MOS transistors 132, 134, 136 and 138 are formed in the notch respectively. FIG. 7D shows an example where while the induced current film 12 is disposed covering only a part of the coil 14, a notch 140 and a MOS transistor 142 are formed respectively. In each example, a slope of thickness of the insulator in the channel of each MOS transistor, a slope of the control voltage, and a slope of impurity concentration may be in directions equal or opposite to one another. Moreover, the ON region and the OFF region of the channel may be inverted depending on a type of MOS transistor.

Figure 8:
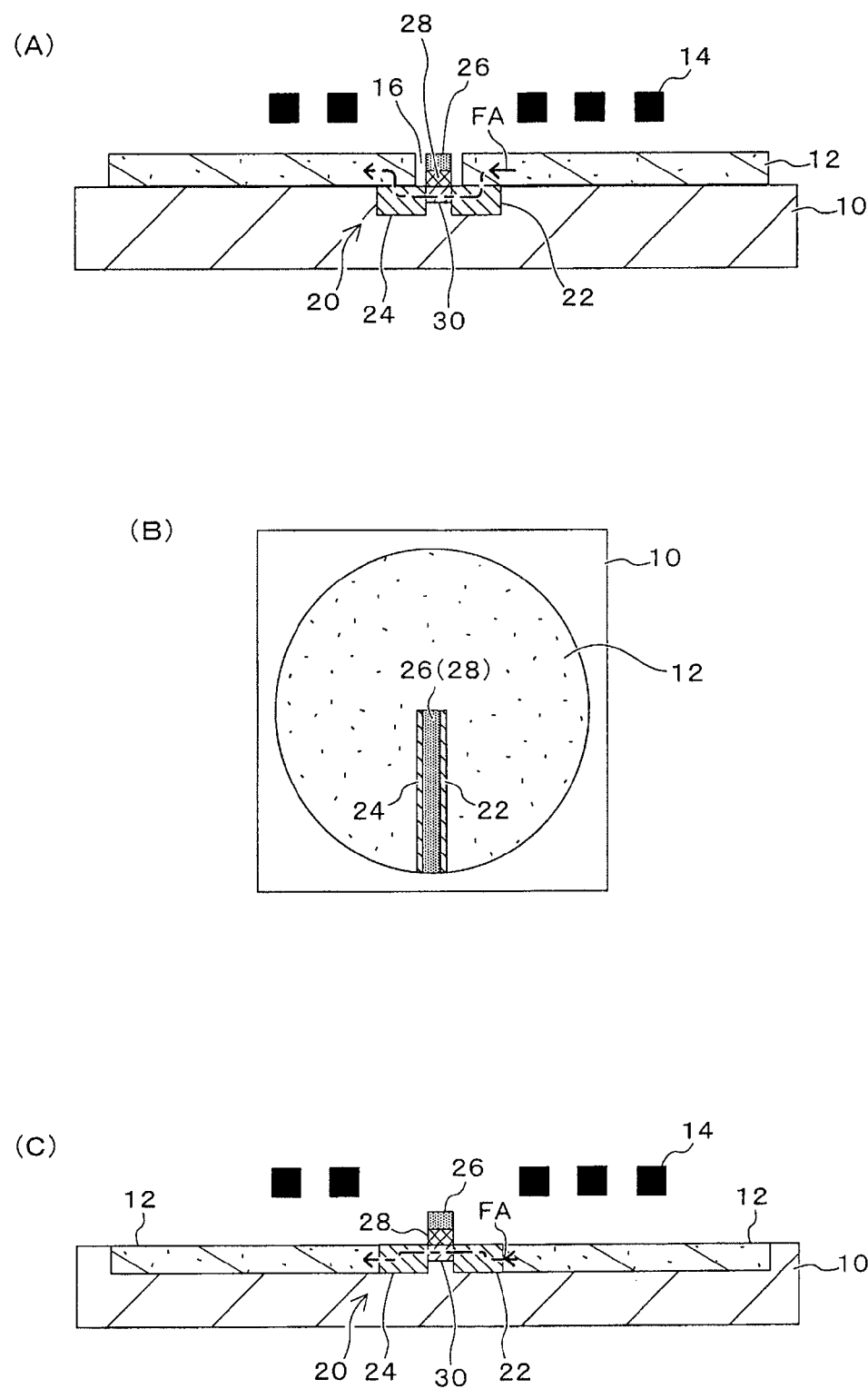

(2) In the examples, a single induced current film was provided below a bottom of the coil. However, two induced current films may be provided sandwiching the coil between them, and a notch and a MOS transistor may be provided in each of the induced current films. Alternatively, an induced current film may be sandwiched by coils. In the examples, the connected conductors 42 and 44 were used to connect between the main terminals 22, 24 of the MOS transistor 20 and the induced current film 12. However, if the substrate 10 is insulative, the induced current film 12 may be formed on the substrate 10 so as to be directly coupled with the main terminals 22, 24 of the MOS transistor 20 as shown in FIG. 8A. When FIG. 8A is seen in planar view, FIG. 8B is given. Furthermore, as shown in FIG. 8C, when the main terminals 22 and 24 of the MOS transistor 20 are formed, the induced current film 12 may be formed at the same time.

(3) In the examples, a MOS transistor having a long gate length is used as an element for controlling an induced current. However, any type of switching element such as FET may be used if it can change a boundary between a continuity region and a non-continuity region between the main terminals. The slope of thickness of the insulator, the slope of the control voltage, and the slope of impurity concentration in respective MOS transistors as shown in the examples may be combined.

(4) While the coil had a square shape in the examples, it may have a circular or polygonal shape. In a word, the coil may have any shape if it can generate inductance in the relevant shape. Similarly, while the induced current film had a square shape in the examples, it may have a circular or polygonal shape. In a word, the induced current film may have any shape if an induced current can flow in the induced current film having the relevant shape.

According to the switching element of the foregoing embodiment, length of an ON region of a channel, in other words, a boundary between a continuity region and a non-continuity region can be changed by voltage control, which is preferable for a variable inductor, a variable filter circuit using the variable inductor, and the like, but should not be limited thereto.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. An inductor comprising:
a coil:
an induced current film in which a current is induced by a current flowing in the coil; and
a switching element comprising:
   a pair of main terminals facing each other in parallel on a semiconductor substrate across a continuity control region,
   a control terminal formed on the semiconductor substrate over the continuity control region, and
   a continuity control unit connected to the control terminal and configured to control a width of a channel connecting the pair of main terminals formed within the continuity control region by changing a value of a control voltage applied to the control terminal,
wherein the induced current film is electrically connected to the pair of main terminals of the switching element, a notch is provided in the induced current film in a flow path of the induced current, and the continuity control region of the switching element is situated in the notch, so that the inductance of the inductor is continuously and smoothly variable.

2. The inductor according to claim 1, wherein thickness of an insulator on or over the continuity control region is changed along a width direction of the channel.

3. The inductor according to claim 1,
wherein the control terminal formed along a length direction of the continuity control region is made as a resistor, thereby changing distribution of the control voltage along the length direction of the continuity control region.

4. The inductor according to claim 1,
wherein impurity concentration in the semiconductor substrate in the continuity control region is changed along a length direction of the continuity control region.

5. The inductor according to claim 1, wherein the coil has a plurality of turns, and the induced current film includes an unitary sheet of film that overlaps the plurality of turns of the coil.

6. An inductor comprising:
a coil;
an induced current film in which a current is induced by a current flowing in the coil; and
a switching element comprising:
   a pair of main terminals formed in parallel along a first direction in a semiconductor substrate and facing each other across a continuity control region between the main terminals, and
   a control terminal formed on the semiconductor substrate over the continuity control region and configured to control a length of a conductive region along the first direction with a change in the magnitude of a control voltage applied by the control terminal,
wherein the induced current film is electrically connected to the pair of main terminals of the switching element, a notch is provided in the induced current film in a flow path of the induced current, and the continuity control region of the switching element is situated in the notch, so that the inductance of the inductor is continuously and smoothly variable.

7. The inductor according to claim 6, wherein the switching element further comprises an insulating element located below the control terminal and above the continuity control region, and the thickness of the insulator is continuously varied along the first direction.

8. The inductor according to claim 6, wherein the coil has a plurality of turns, and the induced current film includes an unitary sheet of film that overlaps the plurality of turns of the coil.

9. An inductor comprising:
a coil;
a conductive element in which a current flow is induced by a current flowing in the coil; and
one or more switching elements controlling the current flowing in the conductive element,
wherein at least one switching element includes means for continuously changing a width of a channel in the switching element, so that the inductance of the inductor is continuously and smoothly variable.

10. The inductor according to claim 9, wherein the coil has a plurality of turns, and the conductive element includes an unitary sheet of film and extends across the plurality of turns of the coil.

* * * * *